United States Patent [19]

Bosch

[11] 4,137,468
[45] Jan. 30, 1979

[54] METHOD AND APPARATUS FOR CORRECTING PULSE TIMING PATTERN

[75] Inventor: Fridolin L. Bosch, Bethlehem, Pa.

[73] Assignee: Bell Telephone Laboratories, Incorporated, Murray Hill, N.J.

[21] Appl. No.: 767,796

[22] Filed: Feb. 11, 1977

[51] Int. Cl.² ............................................. H03 5/01
[52] U.S. Cl. ................................... 307/268; 307/237; 307/296 A; 307/262; 307/264; 307/DIG. 1
[58] Field of Search ............... 307/293, 237, 268, 296, 307/296 A, 232, 262, 265, 264, DIG. 1

[56] References Cited

U.S. PATENT DOCUMENTS

| | | | |
|---|---|---|---|
| 3,202,919 | 8/1965 | Kitz et al. ............................ | 307/237 |
| 3,235,866 | 2/1966 | Ogay .................................... | 307/237 |
| 3,247,363 | 4/1966 | Jenkins ................................ | 307/237 |
| 3,467,838 | 9/1969 | Glazebrook et al. ............... | 307/268 |

*Primary Examiner*—Stanley D. Miller, Jr.
*Assistant Examiner*—B. P. Davis
*Attorney, Agent, or Firm*—Lucian C. Canepa; Lester H. Birnbaum

[57] ABSTRACT

The timing pattern of incoming pulses is modified by amplifying the pulses, selectively shifting the dc potential of the amplified pulses, and clipping or slicing the amplified pulses at a predetermined potential. The thus clipped or sliced output pulses have a predetermined timing pattern at a predetermined dc level, resulting in a time pattern correction of the incoming pulses.

11 Claims, 9 Drawing Figures

METHOD AND APPARATUS FOR CORRECTING PULSE TIMING PATTERN

The present invention relates to pulse timing circuits and more particularly to a method and an apparatus for correcting pulse timing patterns.

BACKGROUND OF THE INVENTION

In most pulse circuits, input information is applied in the form of a random sequence of pulses. These pulses cause the information stored in such circuits to change from one binary state to another binary state. In order to appreciate and discuss the problems encountered in prior art circuits, reference is made to FIGS. 1A and 1B where a sequence of input pulses $P_i$ is shown. Upon arrival of an input pulse $P_1$, the information stored in the circuit changes from one logic state, present before the arrival of $P_1$, to another logic state. In this type of circuit, a potential exists for each of the two states. For example, a high potential may represent a logic "1," while a low potential may represent a logic "0." Usually the changes in potential in response to the input pulses $P_i$ take place with a certain delay caused by the various switching time responses and time constants of the elements constituting the circuit.

As shown in FIG. 1A, after application of input pulse $P_1$, a time interval elapses before reaching the "low" potential corresponding to the "new" logic state. Similarly, upon application of another input pulse such as $P_2$, the potential changes from a "low" state, present before the arrival of $P_2$, to a "high" state. After application of $P_2$, some time interval elapses before the "high" potential level is reached. Each of these two time intervals may be split into two components, namely a delay time which elapses before the potential starts to change, and a transition time during which the actual change takes place.

Referring now to FIG. 1B, if one considers any two potential changes, for example — one to a low state and one to a high state — on a relative time base starting with zero at the respective input pulses, it appears that the respective delay times and transition times for the two changes are unequal. Therefore, an input time pattern of pulses $P_i$ will not be preserved at the output of such prior art circuits. Furthermore, at high rates approaching or exceeding 100 MHz, differences of nanoseconds or fractions of a nanosecond would render the original information distorted to such an extent that it would become irretrievable. Therefore, a time pattern correction or modification of the output signals is required prior to reading or using the content of the information.

Use of plate-catching diode arrangements to shorten the rise time of pulses is described at pages 134–135 of the book by J. Millman and H. Taub entitled "Pulse and Digital Circuits" published by McGraw-Hill Book Company, Inc., 1956. In this known arrangement, a pair of diodes coupled to the plate of a triode are used to limit the swing of the output pulses thereby shortening their rise time. Such an arrangement does not affect the width of a pulse at a predetermined potential level since such width remains constant before as well as after the clipping actions of the diodes. In other words, in this known arrangement, only the upper and lower limits of the pulses are modified by the clipping voltages applied to the diodes without affecting the time pattern of the pulses. Another diode-limiting circuit, referred to as a collector-catching diode circuit, is described at pages 351–352 of the book by J. M. Doyle entitled "Pulse Fundamentals," Second Edition, 1973. This known circuit presents the same disadvantages as discussed above with reference to the Millman and Taub arrangement, namely the circuit does not and cannot correct or modify the time pattern of pulses.

SUMMARY OF THE INVENTION

The foregoing problems are solved in accordance with an embodiment of the present invention wherein a method for modifying the timing pattern of incoming pulses comprises the steps of coupling the incoming pulses to an amplifier stage for amplifying the incoming pulses, selectively shifting the dc potential of the amplified pulses, and limiting the amplified pulses at a predetermined potential thereby delivering output pulses having a modified timing pattern at a predetermined dc level. In accordance with the present invention, the pulse-limiting step may comprise either a clipping step or a pulse-slicing step. In accordance with one illustrative embodiment, the shifting step comprises the step of shifting the dc potential of the incoming pulses prior to the amplifying step. In another illustrative embodiment of the invention, the shifting step comprises the step of varying the biasing potential of the amplifier stage. In a further illustrative embodiment of the invention, the slicing step further comprises the step of varying the predetermined potential at which the amplified pulses are sliced.

An illustrative embodiment of a circuit for modifying the timing pattern of pulses according to the above method comprises an input terminal for receiving incoming pulses, and a transistor amplifying stage for delivering amplified intermediate pulses at its collector terminal. In accordance with the present invention, the circuit further comprises potential shifting circuitry coupled to the amplifying stage for shifting the dc potential of the intermediate pulses. In one illustrative embodiment of the present invention, a semiconductive diode is coupled to the collector of the amplifying stage and to a reference potential for clipping the intermediate pulses thereby modifying the timing pattern of the circuit output pulses at a predetemined dc level. The potential shifting circuitry may comprise a dc level shifter coupled between the input terminal and the amplifying stage and/or a variable power supply coupled to the biasing terminals of the amplifying stage.

In another illustrative embodiment of the present invention, a differential switching stage has one input terminal coupled to the collector of the transistor of the amplifying stage, and the other input terminal coupled to a predetermined reference potential for slicing the intermediate pulses at such a predetermined potential, thereby modifying the timing pattern of the circuit output pulses.

One object of the present invention is to correct or modify the timing pattern of pulses.

Another object of the present invention is to achieve time pattern correction of pulses by means of a compact, simple, and economical circuit.

A further object of the present invention is to provide simple adjustable circuitry for minimizing time pattern distortions between the input and the output terminals of pulse mode circuits.

A still further object of the present invention is to provide a method and an apparatus for intentionally distorting the timing pattern of pulses thereby compensating for nonlinearities in the loads operating in response to such pulses.

These and other objects and advantages of this invention will appear more fully upon consideration of the various illustrative embodiments now to be described in detail in connection with the accompanying drawings.

DETAILED DESCRIPTION OF THE DRAWINGS

Figure 1A:
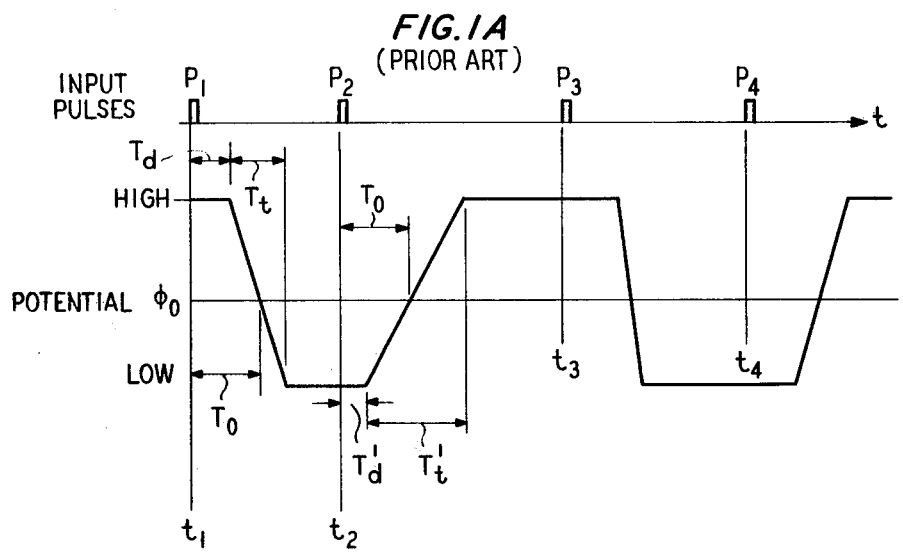
FIGS. 1A and 1B illustrate the problems encountered in prior art pulse circuits.
Figure 1B:
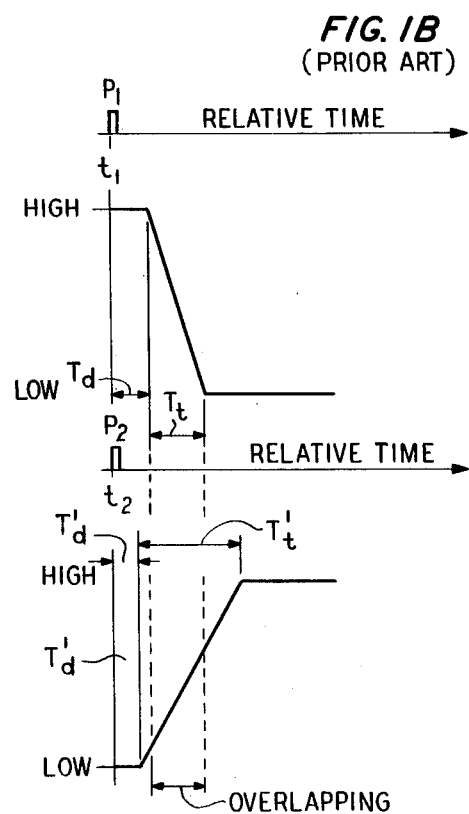

Referring back to FIGS. 1A and 1B, restoration of the input time pattern is possible if certain conditions for the delay and transition times are met. In FIG. 1B, restoration or correction of the time pattern will take place if there is "overlapping" during the two transition intervals. In other words, such a condition can be expressed by $$T_d + T_t > T_d' \qquad (1)$$

and simultaneously $$T_d' + T_t' > T_d \qquad (2)$$

In addition, the sum of the respective transition times must be smaller than the minimum time interval between two consecutive pulses; otherwise, either or both of the steady "high" and "low" potentials would not always be reached. Therefore, a third condition expressed by $$T_t + T_t' > t_2 - t_1 \qquad (3)$$

must be met. The above three conditions guarantee that the time pattern at an intermediate potential $\phi_o$ between "high" and "low" is equal to the input time pattern of pulses $P_i$ shifted by a constant time $T_o$. Therefore, according to the principles of the present invention, the different time behavior of the potential on both sides of $\phi_o$ is the basis for adjusting and correcting the time pattern of the output pulses.

Figure 2:
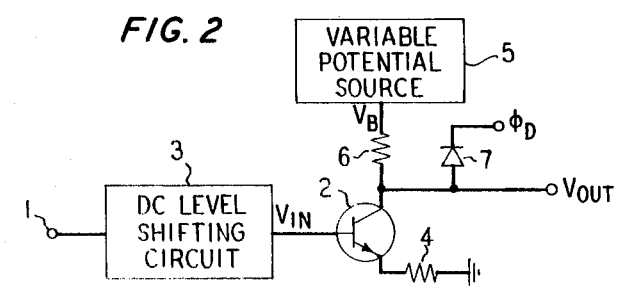
FIG. 2 shows one illustrative embodiment of the present invention.

FIG. 2 shows one illustrative embodiment of a time-correcting circuit according to the present invention. The circuit comprises an input terminal 1 for receiving incoming input signals and a transistor amplifier 2 having its base coupled to the input terminal 1 via a dc level shifting circuit 3. The emitter of transistor 2 is coupled to ground potential via emitter resistor 4, and the collector of transistor 2 is coupled to a variable potential source 5 via collector resistor 6. The requirement of having the level shifting circuit 3 and/or the variable source 5 in the time-correcting circuit will be hereinafter explained in connection with FIGS. 3 and 4. The circuit further comprises a semiconductive limiting or clipping diode 7 having its anode connected to the collector of transistor 2 and its cathode coupled to a limiting potential $\phi_D$. The output signals $V_{OUT}$ of the circuit are derived from the collector of transistor 2.

Level shifting circuit 3 may, for example, comprise a plurality of diodes coupled in series, the total potential shift being equal to the sum of the respective voltage drops in each diode. Another level shifting circuit comprising a transistor with a Zener diode coupled to its emitter terminal would also achieve a potential shift equal to the sum of the base-emitter voltage of the transistor and the breakdown voltage of the Zener diode. Also, incoming input signals at terminal 1 can be shifted by means of a single Zener diode. Such level shifting is determined by the breakdown voltage of the diode. However, other possible arrangements of conventional level shifting circuits may be substituted for circuit 3 without departing from the scope and spirit of the present invention.

Figure 3:
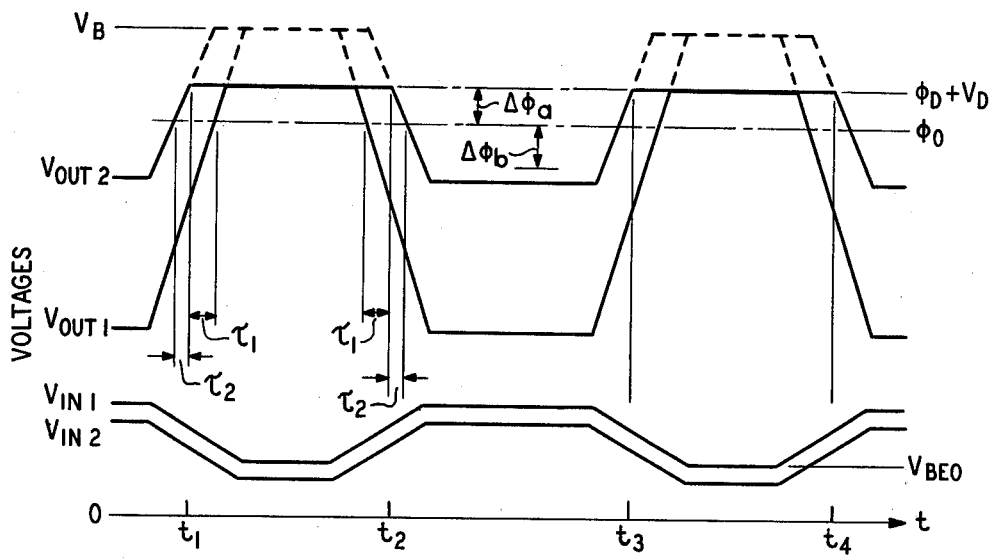
FIG. 3 is a pulse diagram of one mode of operation of the embodiment shown in FIG. 2.

In the time diagram shown in FIG. 3, the dc component of the input signal present at input terminal 1 is varied in level shifting circuit 3. The dc component is selected such that the lower levels of $V_{IN2}$ and $V_{IN1}$ stay below or equal to $V_{BEO}$, and the upper level of $V_{IN2}$ stays above $V_{BEO}$, $V_{BEO}$ being the base-emitter voltage of the transistor 2 above which the collector current rises rapidly. Under these conditions, a rise in the input signal dc component results in an increased output voltage swing. The upper limit of the output voltage would be equal to the constant bias voltage $V_B$ if the clipping diode 7 were not present. However, the clipping diode 7 with a forward voltage drop $V_D$ keeps the upper signal limit at $\phi_D + V_D$, where $\phi_D$ is the cathode reference potential of the diode. By adjusting $\phi_D$, $\phi_D + V_D$ can be set at a well-defined value above $\phi_o$, $\phi_o$ being the potential where the corrected timing pattern is required. The following stage of the circuit is designed to operate between two potential levels $\phi_o + \Delta\phi_a$ and $\phi_o - \Delta\phi_b$, wherein $\Delta\phi_a$ and $\Delta\phi_b$ are potentials determined by the various components and bias of the following stage. The potentials $\Delta\phi_a$ and $\Delta\phi_b$ are such that $\Delta\phi_a + \Delta\phi_b$ is smaller than the amplitude of the output voltage swing before any clipping action. By considering the time pattern at the potential $\phi_o$, one sees that with an input signal in the range of $V_{IN1}$ to $V_{IN2}$ the original input time slot $t_2 - t_1$ is varied by $-2\tau_1$ to $+2\tau_2$ while the following time slot $t_3 - t_2$ experiences the opposite change of $+2\tau_1$ to $-2\tau_2$.

Figure 4:
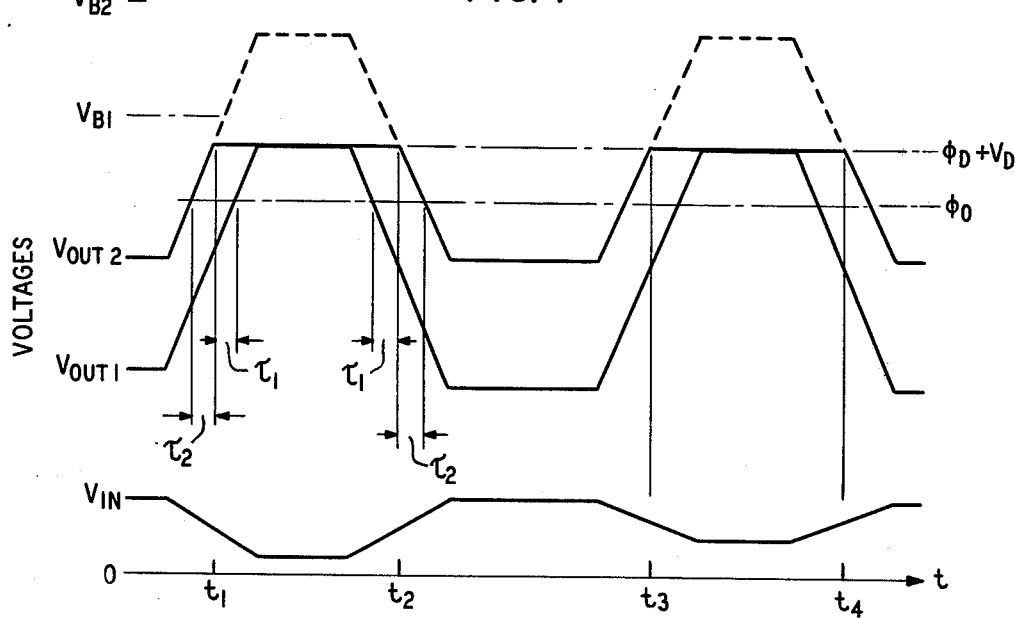
FIG. 4 is a pulse diagram of another mode of operation of the embodiment shown in FIG. 2.

In the time diagram shown in FIG. 4, the dc level of input signal $V_{IN}$ applied at the base of transistor 2 is kept constant. In accordance with another mode of the operation of the illustrative embodiment of FIG. 2, the power supply voltage $V_B$ generated by potential source 5 is changed between $V_{B1}$ and $V_{B2}$ by means, for example, of a variable resistor. Other ways of varying the bias potential may be used without departing from the spirit of the invention. The result is that the output potentials $V_{OUT1}$ and $V_{OUT2}$, without clipping diode 7, are just moved up or down in potential along with $V_{B1}$ and $V_{B2}$. However, in the presence of a clipping potential $\phi_D$ coupled to the cathode of clipping diode 7, the output signals $V_{OUT1}$ and $V_{OUT2}$ are limited at $\phi_D + V_D$. As already discussed in connection with FIG. 3, the time pattern of the output signals at the potential $\phi_o$ is varied by $-2\tau_1$ to $+2\tau_2$ for the $t_2 - t_1$ time slot, and is varied by $+2\tau_1$ to $-2\tau_2$ for the $t_3 - t_2$ time slot. Thus, in accordance with the present invention, time pattern correction can be achieved either by shifting the level of incoming input pulses or by varying the potential of the bias supply of the amplifying stage, or both. For the mere time diagrams shown in FIGS. 3 and 4, the following stage of the time-correcting circuit of the present invention should be designed in such a way that any intermediate signal at or below $\phi_o - \Delta\phi_b$ results in a constant output signal.

Figure 5:
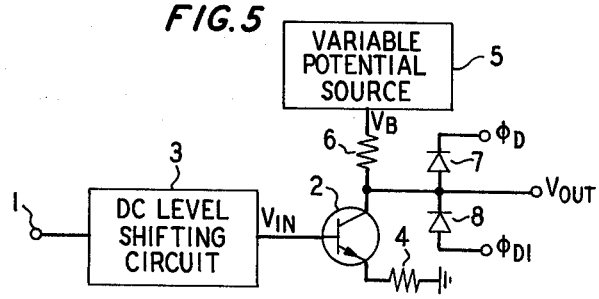
FIG. 5 shows another illustrative embodiment of the present invention.
Figure 6:
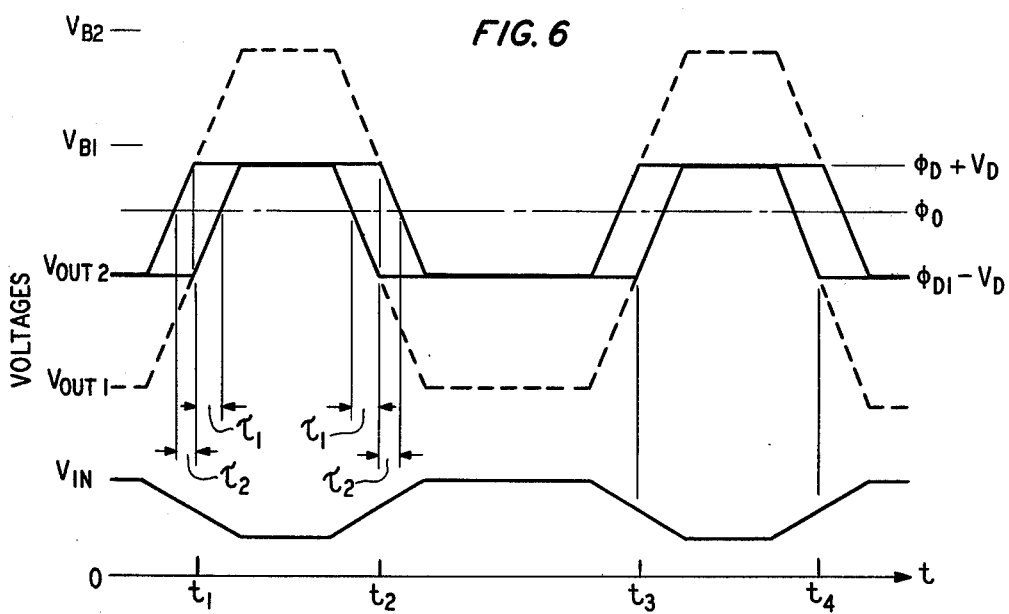
FIG. 6 is a pulse diagram of one mode of operation of the embodiment shown in FIG. 5.

Another illustrative embodiment of the present invention is shown in FIG. 5 which comprises all of the circuit elements shown in FIG. 2, as well as a second limiting or clipping diode 8 having its cathode connected to the collector of transistor 2 and its anode connected to a second clipping potential $\phi_{D1}$. During the operation of such a time-correcting circuit, as shown in FIG. 6, the input signal $V_{IN}$ is kept constant and the bias potential $V_B$ is varied. The two diodes 7 and 8 with their respective clipping potentials $\phi_D + V_D = \phi_o + \Delta\phi_a$ and $\phi_{D1} - V_D = \phi_o - \Delta\phi_b$ cut a window of reduced amplitude out of the unclipped output signal.

Figure 7:
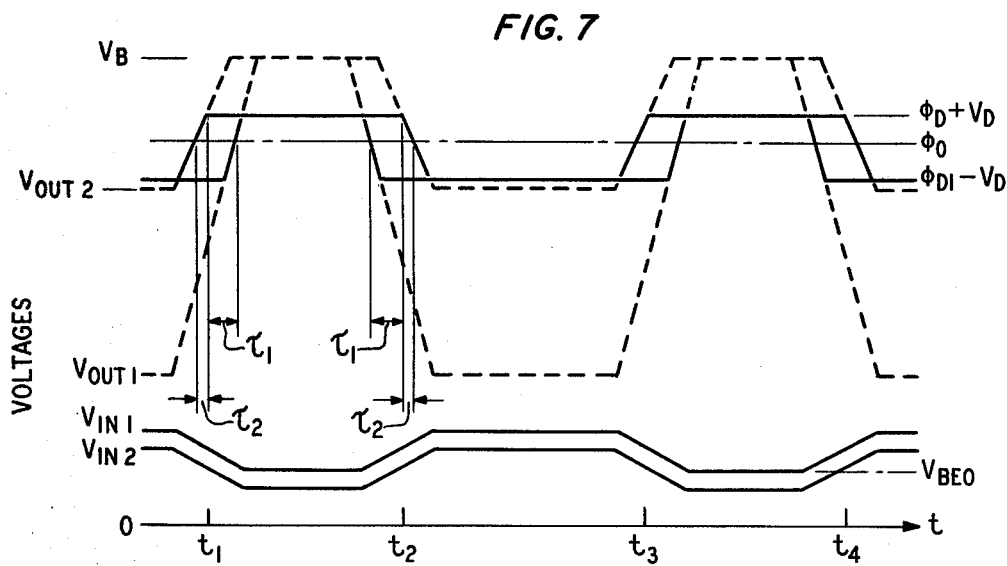
FIG. 7 is a pulse diagram of another mode of operation of the embodiment shown in FIG. 5.

Another mode of operation of the illustrative embodiment of FIG. 5 is shown in FIG. 7 wherein the bias supply potential $V_B$ is kept constant and the dc level of the input signal is shifted by level shifting circuit 3 in a similar manner as explained in connection with FIG. 3.

Figure 8:
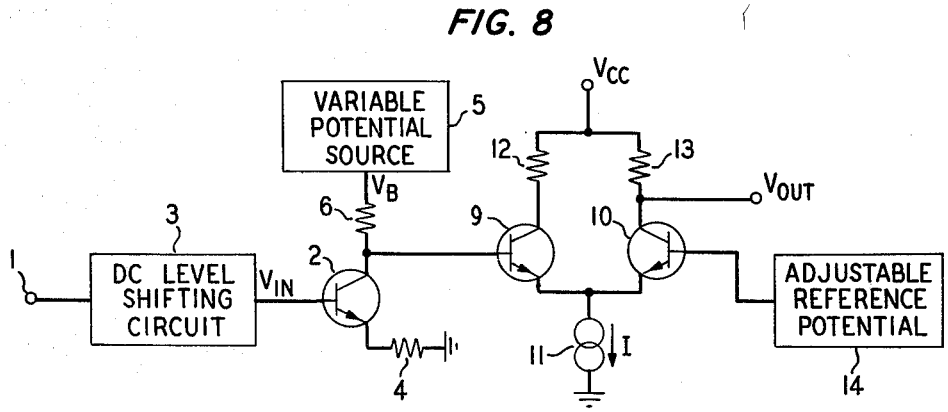
FIG. 8 shows a further illustrative embodiment of the present invention.

A further illustrative embodiment of the present invention is shown in FIG. 8 which comprises all of the circuit elements shown in FIG. 2, with the exception of clipping diode 7. In this illustrative embodiment, a pulse-slicing step is substituted for the clipping step performed by diodes 7 or 8 of FIGS. 2 or 5. The pulse-slicing step is achieved, for example, by means of a differential current switching stage comprising a pair of transistors 9 and 10 having their emitter electrodes connected together and to a current source 11.

Collector resistors 12 and 13 are respectively coupled between a bias supply voltage $V_{cc}$ and the collector electrodes of transistors 9 and 10. The base electrode of transistor 9 is one of the input terminals of the differential current switching stage, which input terminal is coupled to the collector of transistor amplifier 2. The base electrode of transistor 10 is the other input terminal of the differential current switching stage, which other input terminal is coupled to an adjustable reference potential source 14. The current switching stage delivers at its output terminal $V_{OUT}$ a sequence of output pulses of constant amplitude having a modified or corrected timing pattern.

In operation of the embodiment of FIG. 8, as long as the amplitude of the amplified intermediate pulses at the collector terminal of transistor 2 is lower than the reference potential delivered by source 14, transistor 10 is conducting and transistor 9 is not conducting. In this mode of operation, the output signal $V_{OUT}$ has a constant amplitude equal to: $V_{cc} - R_{13} \times I$, wherein $R_{13}$ is the resistance value of resistor 13, and I is the current drawn by current source 11. As soon as the amplitude of the amplified intermediate pulses at the collector terminal of transistor 2 is higher than the reference potential delivered by source 14, the conducting state of transistors 9 and 10 is reversed, i.e. transistor 9 is conducting and transistor 10 is nonconducting. In such a second mode of operation, $V_{OUT}$ is equal to the supply voltage $V_{cc}$ since no current is drawn through resistor 13. Thus, by adjusting the value of the reference potential delivered by source 14, the timing pattern of the output pulses delivered at $V_{OUT}$ can be modified or corrected.

The present invention has been described with reference to particular embodiments. It is to be understood, however, that the described embodiments are merely illustrative of the principles and applications of the invention. Numerous modifications may be made by those skilled in the art without departing from the spirit and scope of the invention.

What is claimed is:

1. A circuit for modifying the timing pattern of pulses as defined by designated time slots comprising:
   an input terminal for receiving incoming pulses;
   a transistor amplifying stage having its base coupled to said input terminal, its emitter coupled to a reference potential, and its collector coupled to a bias potential and delivering amplified intermediate pulses;
   means coupled to said amplifying stage, said means applying a potential to said amplifying stage for selectively shifting the dc potential of said intermediate pulses with respect to a predetermined dc level by an amount such that the resulting widths of the pulses at the predetermined dc level establish a prescribed time shift in relation to said time slots; and
   amplitude limiting means coupled to said collector and to a reference potential terminal for limiting the potential of said intermediate pulses a prescribed amount from said predetermined dc level, said limiting means in combination with said shifting means thereby modifying the timing pattern of the circuit output pulses at said predetermined dc level.

2. Method for modifying the timing pattern of incoming pulses as defined by designated time slots comprising the steps of:
   coupling the incoming pulses to an amplifier stage for amplifying said incoming pulses;
   selectively shifting the dc potential of the amplified pulses with respect to a predetermined dc level by an amount such that the resulting widths of the pulses at the predetermined dc level establish a prescribed time shift of the pulses in relation to said time slots; and
   limiting the potential of said amplified pulses at a predetermined potential difference from said predetermined dc level thereby delivering output pulses having a modified timing pattern at said predetermined dc level.

3. A circuit for modifying the timing pattern of pulses comprising:
   an input terminal for receiving incoming pulses as defined by designated time slots;
   a transistor amplifying stage having its base coupled to said input terminal, its emitter coupled to a reference potential, and its collector coupled to a bias potential and delivering amplified intermediate pulses;
   means coupled to said amplifying stage, said means applying a potential to said amplifying stage for selectively shifting the dc potential of said intermediate pulses with respect to a predetermined dc level by an amount such that the resulting widths of the pulses at the predetermined dc level establish a prescribed time shift of the pulses in relation to said time slots; and at least one semiconductive diode having one electrode coupled to said collector and the other electrode coupled to a limiting potential terminal for clipping said intermediate pulses at a prescribed potential difference from said predetermined dc level, said diode in combination with said shifting means thereby modifying the timing pattern of the circuit output pulses at said predetermined dc level.

4. A circuit for modifying the timing pattern of pulses according to claim 3, wherein said shifting means comprises a circuit arrangement coupled between said input terminal and said base for shifting the dc level of said incoming pulses.

5. A circuit for modifying the timing pattern of pulses according to claim 3, wherein said shifting means comprises circuitry for varying said bias potential.

6. Method for modifying the timing pattern of incoming pulses as defined by designated time slots comprising the steps of:
coupling the incoming pulses to an amplifier stage for amplifying said incoming pulses;
selectively shifting the dc potential of the amplified pulses with respect to a predetermined dc level by an amount such that the resulting widths of the pulses at the predetermined dc level establish a prescribed time shift in relation to said time slots; and
clipping said amplified pulses at a predetermined potential difference from said predetermined dc level thereby delivering output pulses having a modified timing pattern at said predetermined dc level.

7. Method for modifying the timing pattern of incoming pulses according to claim 6, wherein the shifting step comprises the step of shifting the dc potential of the incoming pulses prior to the amplifying step.

8. Method for modifying the timing pattern of incoming pulses according to claim 6, wherein the shifting step comprises the step of varying the biasing potential of the amplifier stage.

9. A circuit for modifying the timing pattern of pulses comprising:
an input terminal for receiving incoming pulses;
a transistor amplifying stage having its base coupled to said input terminal, its emitter coupled to a reference potential, and its collector coupled to a bias potential and delivering amplified intermediate pulses;
means coupled to said amplifying stage for selectively shifting the dc potential of said intermediate pulses; and
a differential current switching stage having one input coupled to said collector and the other input coupled to a reference potential terminal for slicing said intermediate pulses thereby modifying the timing pattern of the circuit output pulses at a predetermined dc level.

10. Method for modifying the timing pattern of incoming pulses as defined by designated time slots comprising the steps of:
coupling the incoming pulses to an amplifier stage for amplifying said incoming pulses;
selectively shifting the dc potential of the amplified pulses with respect to a predetermined reference potential by an amount such that the resulting widths of the pulses at the predetermined reference potential establish a prescribed time shift in relation to said time slots; and
slicing said amplified pulses at said predetermined reference potential to produce pulses having a predetermined potential difference from said predetermined reference potential thereby delivering output pulses having a modified timing pattern at said predetermined reference potential.

11. A circuit for modifying the timing pattern of pulses comprising:
an input terminal for receiving incoming pulses;
a transistor amplifying stage having its base coupled to said input terminal, its emitter coupled to a reference terminal, and its collector coupled to a bias potential terminal and delivering amplified intermediate pulses;
means coupled to said amplifying stage for selectively shifting the dc potential of said intermediate pulses; and
a differential current switching stage having one input coupled to said amplifying stage and the other input coupled to a reference potential terminal for slicing said intermediate pulses thereby modifying the timing pattern of the circuit output pulses at a predetermined dc level.

* * * * *